United States Patent [19]
An et al.

[11] Patent Number: 6,136,674
[45] Date of Patent: Oct. 24, 2000

[54] MOSFET WITH GATE PLUG USING DIFFERENTIAL OXIDE GROWTH

[75] Inventors: Judy X. An, San Jose; Che-Hoo Ng, San Martin, both of Calif.

[73] Assignee: Advanced Micro Devices, Inc., Sunnyvale, Calif.

[21] Appl. No.: 09/245,727

[22] Filed: Feb. 8, 1999

[51] Int. Cl.[7] .................................. H01L 21/3205
[52] U.S. Cl. ............................. 438/585; 438/585
[58] Field of Search .................... 438/585, 591, 438/527, 601, 264; 257/412

[56] References Cited

U.S. PATENT DOCUMENTS

| | | |
|---|---|---|
| 4,920,401 | 4/1990 | Sakai et al. ........................ 438/591 |
| 5,221,632 | 6/1993 | Kurimoto et al. .................. 438/585 |
| 5,610,430 | 3/1997 | Yamashita et al. ................. 257/412 |

OTHER PUBLICATIONS

IEDM Technical Digest, K. Kurimoto et al., "A T–Gate Overlapped LDD Device With High Circuit Performance And High Reliability", Dec. 1991, pp. 541–544.

*Primary Examiner*—David Nelms
*Assistant Examiner*—Dung A Le

[57] ABSTRACT

A semiconductor device is formed having a gate electrode and a gate oxide comprising a central portion and edge portions having a thickness greater than that of the edge portions. Nitrogen is ion implanted into the surface of the semiconductor substrate to retard the growth of the central portion of the gate oxide, thereby enabling formation of gate oxide having a thin central portion and thicker edge portions.

14 Claims, 3 Drawing Sheets

MOSFET WITH GATE PLUG USING DIFFERENTIAL OXIDE GROWTH

FIELD OF THE INVENTION

The present invention relates generally to a method of manufacturing semiconductor devices comprising a transistor. The invention has particular applicability in semiconductor devices comprising a metal-oxide-semiconductor (MOS) transistor exhibiting high performance with reliability.

BACKGROUND ART

The escalating requirements for high performance and density associated with ultra large scale integration semiconductor devices require high speed and reliability and increased manufacturing throughput for competitiveness. Conventional practices are primarily based upon a silicon gate complementary MOS (CMOS) process, wherein a gate electrode and corresponding source and drain regions are formed by self alignment, and the withstand voltage (threshold voltage) determined by the impurity concentration level of the drain region.

Various efforts have been made in order to obtain a semiconductor with high density and a low power consumption, by increasingly reducing the gate oxide thickness and effective channel length. However, a reduced oxide thickness causes an increase in the vertical electric field effect and overlapping (parasitic) capacitance adversary affecting the delay time and power consumption of the circuits.

In order to reduce the vertical electric field effect and overlapping (parasitic) capacitance, a T-shaped gate structure is suggested by K. Kurimoto et al., IEEE 1991 IEDM Technical Digest, pp. 541–544. In the gate structure of Kurimoto et al., the thickness of both end portions of the gate insulating film is bigger than the thickness of the center portion. The thicker end portions and thinner center portion reduce the overlapping capacitance, and enable the formation of shallow source and drain extensions with a higher impurity concentration, thereby increasing the higher withstand voltage. In addition, the gate insulating film structure enables the shallow source/drain extensions to extend to the substrate underlying the end portions of the gate oxide, thereby reducing the effective channel length. Moreover, the thicker end portions reduce the hot carrier injection effect. Thus, the T-shape gate electrode provides high speed performance and high densification.

According to the semiconductor fabrication method by K. Kurimoto et al., the semiconductor device exhibiting the T-shape gate structure is formed by oxidizing the surface of a P-doped polysilicon gate electrode so as to form gate bird's beaks at both ends of the gate oxide film. However, the sidewall oxide films, formed on both sides of the gate electrode and function as a mask during the ion implantation steps to form the source and drain regions, shift the source and drain regions farther to outer positions, thereby increasing the effective channel length.

Another method of forming a T-shaped gate is disclosed in U.S. Pat. No. 5,610,430 to Yamashita et al. and illustrated in FIG. 1 to FIG. 6. In accordance with the method disclosed by Yamashita et al., as shown in FIG. 1, an oxide film 12 is formed on the surface of the semiconductor substrate 10. A polycrystalline silicon film 14 is then formed on the gate oxide film 12. Thereafter, a photoresist 16 is formed in a selected region on the polycrystalline silicon film 14. As shown in FIG. 2, portions of the polycrystalline silicon film 14 are etched by an anisotropic etching technique, thereby forming a gate electrode portion 20 and a thin film portion 22. After removing the photoresist 16, as shown in FIG. 3, a silicon nitride film 30 is deposited on the surface of the substrate 10, covering the gate electrode portion 20 and thin film portion 22. Then, as shown in FIG. 4, the thin film portion 22, a surface portion of the oxide layer 12, a silicon nitride film 30 are etched by an anisotropic etching technique, leaving a gate oxide 44 and thin oxide film 46 on the surface of the substrate 10, and the silicon nitride layer 30 on the side surfaces the gate electrode 20. As a result, the upper portion on the side surfaces of the gate electrode 20 is covered with the silicon nitride film 30 and the lower portions 42 of the side surfaces of the gate electrode 20 are exposed. Subsequently, as shown in FIG. 5, a thermal oxidation is conducted, thereby growing thermal oxide film on the exposed lower portions 42 and the thin oxide film 46. During oxidation, the exposed lower portions of the gate electrode 14 grow outwardly in a horizontal direction, thereby forming sidewall spacers combined with the silicon nitride layer film 30. Also, the exposed lower portions grow inwardly in a horizontal direction and thicker oxide portions are formed at both ends of the gate oxide 44, thereby forming, T-shaped gate electrode 40. An oxide layer 50 is also formed on the surface of the substrate 10 by oxidizing the thin oxide film portion 22. Once again, the oxide layer and the sidewall spacers are anisotropically etched in vertical direction, thereby forming the thicker sidewall spacers than the oxide layer. Then, source and drain regions 60 are formed at the surface of the semiconductor substrate 10 by ion implantation step, employing the gate electrode 14 as a mask, thereby forming shallow source/drain regions extending to the surface of the substrate 10 underlying the thicker oxide portions of the gate oxide 44, and source/drain regions formed under the oxide layer 50.

The method disclosed in Yamashita et al., however, requires complicated manufacturing steps, e.g., repeated anisotropic etching steps, e.g., to form the thin film portion 22 of the polycrystalline silicon 14, to expose the lower portions of the polycrystalline gate electrode 42, and to etch the sidewall spacers and the oxide layer 50 to the suitable thicknesses to form the source/drain regions 60 including shallow source/drain extensions by the subsequent ion implantation step. Extremely accurate controls are required during each anisotropic etching step because the doping concentration levels of the source and drain regions and shallow source/drain extensions are directly dependent to the thickness of the oxide formed by the repeated anisotropic etching steps.

For the reason identified above, there exists a need for simplified and production worthy methodology for manufacturing a semiconductor device comprising a T-shaped gate electrode.

DISCLOSURE OF THE INVENTION

An advantage of the present invention is a simplified, efficient, and production worthy method for manufacturing a semiconductor device comprising a T-shaped gate plug structure.

Additional advantages and other features of the present invention will be set forth in part in the description which follows and in part will become apparent to those having ordinary skill in the art upon examination of the following or may be learned from the practice of the present invention. The objects and advantages of the present invention may be realized and obtained as particularly pointed out in the appended claims.

According to the present invention, the foregoing and other advantage are achieved in part by a method of manufacturing a semiconductor device, the method comprising: ion implanting nitrogen into a surface portion of a semiconductor substrate or well region formed in the substrate; and thermally oxidizing the surface to form a gate oxide layer comprising a central portion having a first thickness formed on the nitrogen ion implanted surface and edge portions having a second thickness greater than the first thickness and sandwiching the central portion.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

DESCRIPTION OF INVENTION

The present invention enables manufacturing a semiconductor device having a transistor comprising a gate plug electrode by forming the central portion of a gate oxide on a nitrogen region. The nitrogen region retards the growth of the central portion of a gate oxide while edge portions of a gate oxide grow at the normal rate, thereby enabling the edge portions to have a thickness greater than the thickness of the central portion. Accordingly, the present invention provides simplified, efficient, and production worthy methodology for manufacturing a T-shaped gate transistor.

Figure 7:
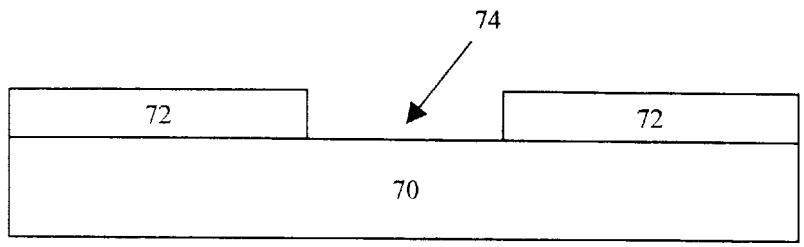
FIGS. 7 to 14 illustrate sequential phases of a method according to an embodiment of the present invention, similar features being denoted by similar reference numerals.

In accordance with an embodiment of the present invention, as shown in FIG. 7, a mask layer 72, e.g., a conventional photoresist layer, is formed on a surface of semiconductor substrate 70, patterned and etched by conventional photolithographic and etching techniques to form a mask defining opening 74.

Figure 8:
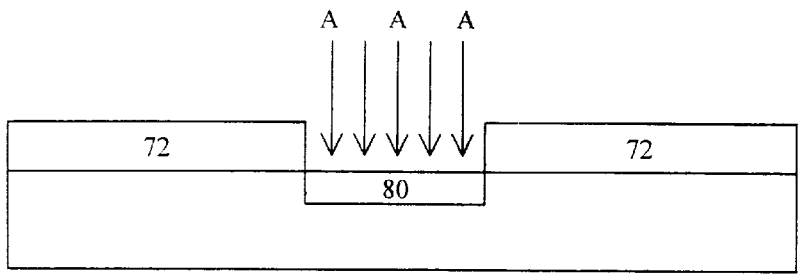

As shown in the FIG. 8, nitrogen is ion implanted into the semiconductor substrate 70, as shown by arrows A, e. g., at an implantation dosage of about $1 \times 10^{12}$ atoms $cm^{-2}$ to about $5 \times 10^{15}$ atoms $cm^{-2}$ and at an implantation energy of about 2 KeV to about 100 KeV, to form a nitrogen implanted region 80 at the surface portion of the semiconductor substrate underlying the opening 74 as by vertical ion implantation (arrows A), employing the first PR mask 72 as a mask. After ion implanting nitrogen into the semiconductor substrate 70, the mask layer 72 is removed.

Figure 9:
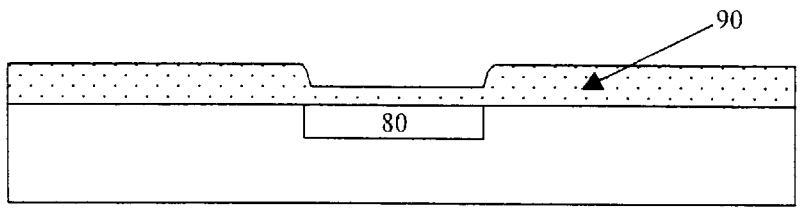
Figure 10:
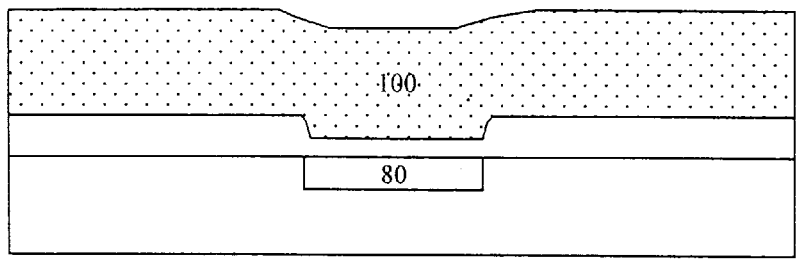

As shown in FIG. 9, an oxide layer 90 is then formed on the surface of the substrate 70 and the opening 74 by thermal oxidation, e.g., rapid thermal process (RTP), as at a temperature of about 800° C. to about 1000° C. for a short period of time, e.g., less than 60 seconds. The nitrogen implanted region 80 in the surface of the substrate underlying the opening 74, retards oxidation. It is believed that the implanted nitrogen atoms prevent the oxidizing species from reaching the silicon substrate during thermal oxidation because oxygen and water vapor diffuse very slowly through the implanted nitrogen. Accordingly, the implanted nitrogen region 80 retards the growth of the oxide layer 90 formed overlying the opening 74, as by limiting the thickness to about 15 Å to about 40 Å, while the rest of the oxide layer grows as at a higher rate to a thickness of about 40 Å to about 100 Å. A conductive layer 100 is then formed on the surface of the oxide layer 90, as shown in FIG. 10.

Figure 11:
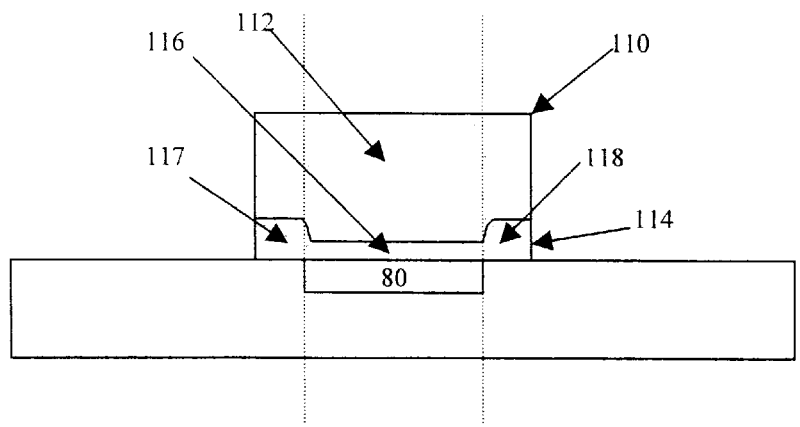
Figure 12:
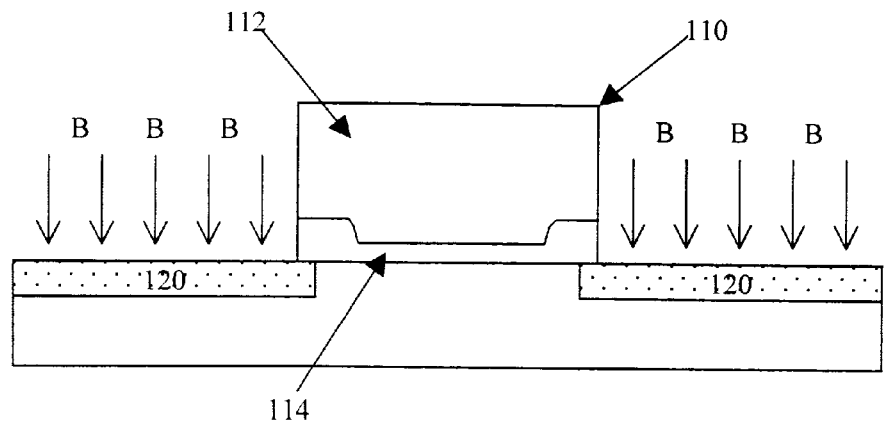
Figure 13:
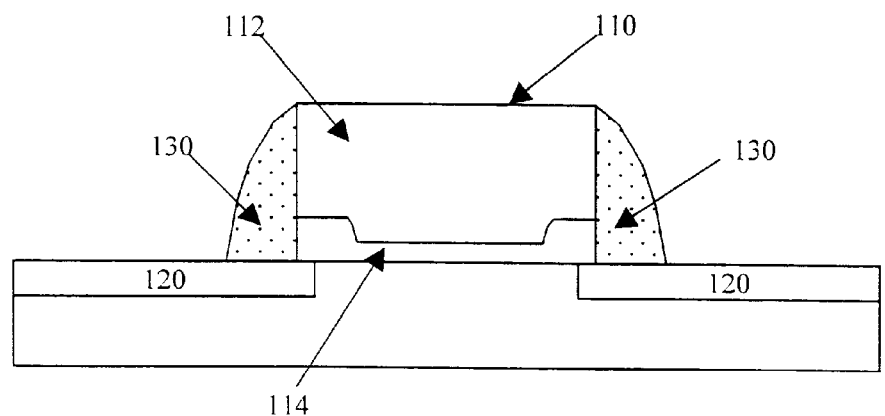
Figure 14:
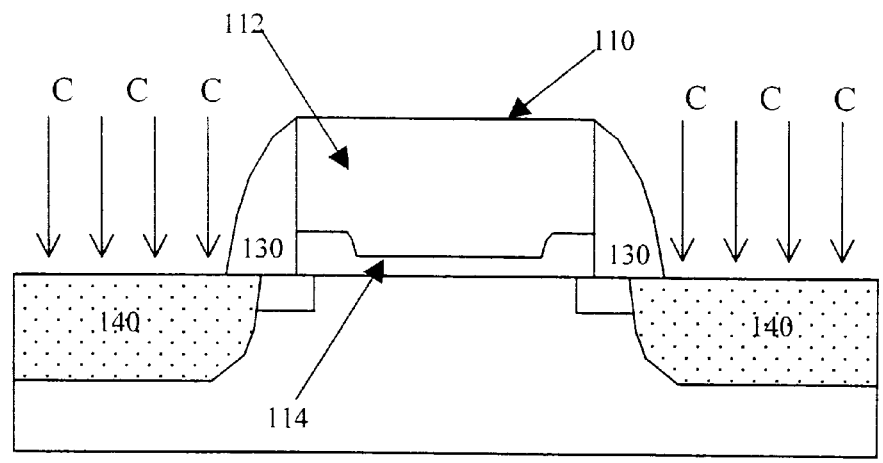

As shown in FIG. 11, the oxide layer 90 and conductive layer 100 are patterned, as by conventional photolithographic and etching techniques, to form a gate 110 which comprises a gate plug electrode 112 and a gate oxide 114, wherein the gate oxide 114 comprises and edge portions 117, 118 and a core portion 116 formed on the nitrogen implanted region 80 between the edge portions 117, 118.

Embodiments of the present invention include, subsequent processing, as by annealing to repair lattice damage caused by nitrogen-implantation, e.g., rapid thermal annealing at a temperature of about 950° C. to about 1150° C. for about 5 seconds to 30 seconds in a nitrogen or argon containing environment, followed by conventional processing.

Figure 1:
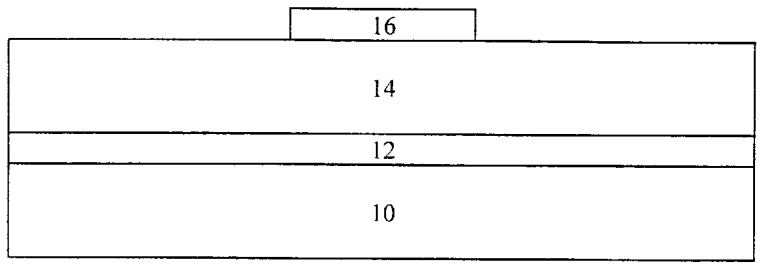
FIGS. 1 to 6 illustrate sequential phases of a prior art method, similar reference numerals denoting similar features being denoted by similar reference numerals.
Figure 2:
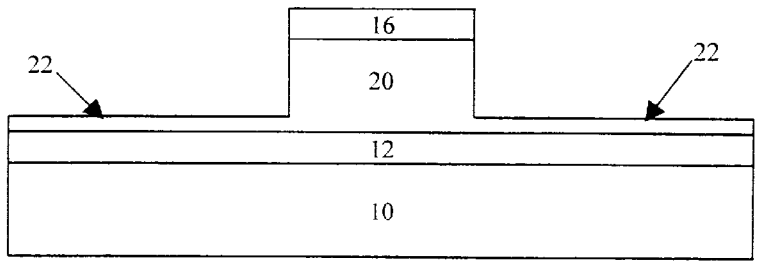
Figure 3:
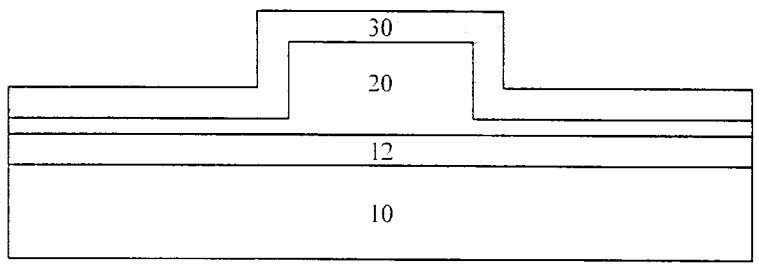
Figure 4:
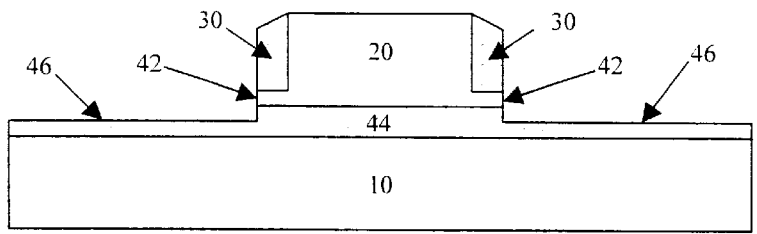
Figure 5:
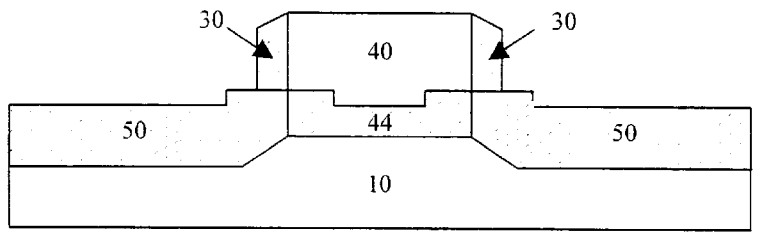
Figure 6:
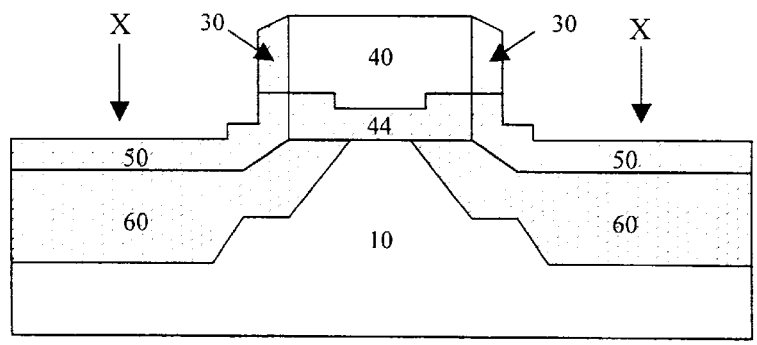

Embodiments of the present invention also comprise: ion implanting (arrows B), e.g., an n-type impurity, in substrate 70 to form shallow source/drain extensions 120 using the gate 110 as a mask, as shown in FIG. 6; forming sidewall spacers 130 on the side surfaces of the gate 110 as shown in FIG. 7; and ion implanting (arrows C), e.g., an n-type impurity in substrate 70, to form source/drain regions 140 using the gate 110 and sidewall spacers 130 as a mask.

The material processing techniques, such as deposition, photolithographic, and etching techniques, employed in the present invention are those typically employed in manufacturing conventional semiconductor devices and, hence, are not set forth herein in detail.

Thus, by the present invention, a simplified, efficient, and production worthy method for manufacturing a semiconductor device having a transistor with a gate electrode is achieved by forming a thin central portion of a gate oxide on a nitrogen-containing surface of the semiconductor substrate. The resulting method is advantageously characterized by reduced and simplified manufacturing steps.

The present invention enjoys industrial applicability in various types of semiconductor devices, particularly in semiconductor devices designed for high speed performance. Therefore, the present invention is applicable to any CMOS technology.

Only the preferred embodiment of the present invention and but a few examples of its versatility are shown and described in the present disclosure. It is to be understood that the present invention is capable of use in various other combinations and environments and is capable of changes or modification within the scope of the inventive concept as expressed herein.

What is claimed is:

1. A method of manufacturing a semiconductor device, which method comprises:

ion implanting nitrogen into a surface portion of a semiconductor substrate or well region formed in the substrate;

thermally oxidizing the surface to form a gate oxide layer, the gate oxide layer comprising:

a central portion having a first thickness formed on the nitrogen ion implanted surface; and edge portions having a second thickness greater than the first thickness and sandwiching the central portion; and forming a gate electrode layer on the central portion and the edge portions of the gate oxide layer.

2. The method according to claim 1, further comprising patterning the gate oxide layer and the gate electrode layer to form a gate electrode and a gate oxide comprising the central portion and edge portions underlying the gate electrode.

3. The method according to claim 2, wherein the first thickness of the central portion is about 15 Å to about 40 Å.

4. The method according to claim 2, wherein the second thickness of each edge portion is about 40 Å to about 100 Å.

5. The method according to claim 1, wherein the ratio of the first thickness to the second thickness is about 1:3.

6. The method according to claim 1, comprising ion implanting nitrogen at an implantation dosage of about $1 \times 10^{12}$ atoms/cm$^2$ to about $5 \times 10^{15}$ atoms/cm$^2$ at an implantation energy of about 2 KeV to about 100 KeV.

7. The method according to claim 6, comprising ion implanting nitrogen at an implantation dosage of about $5 \times 10^{12}$ atoms/cm$^2$ and an implantation energy of about 10 KeV.

8. The method according to claim 1, further comprising annealing the semiconductor substrate after ion implanting nitrogen.

9. The method according to claim 8, comprising rapid thermal annealing at a temperature of about 950° C. to about 1150° C. for about 5 seconds to about 30 seconds.

10. The method according to claim 1, comprising thermally oxidizing to form the gate oxide layer at a temperature of about 800° C. to about 1000° C.

11. The method according to claim 1, further comprising ion implanting to form source and drain regions.

12. The method according to claim 11, comprising:

ion implanting impurities using the gate electrode and gate oxide as a mask, to form shallow source and drain extensions;

forming sidewall spacers on side surfaces of the gate electrode and the gate oxide; and ion implanting impurities, using the gate electrode, gate oxide and sidewall spacers as a mask, to form source and drain regions.

13. The method according to claim 11, comprising implanting impurities, using the gate electrode and gate oxide as a mask, to form the source and drain regions.

14. The method according to claim 1, wherein the nitrogen implanted surface portion retards the growth of the central portion of the gate oxide layer with respect to the edge portions.

* * * * *